(12) United States Patent
Kalpat et al.

(10) Patent No.: US 7,279,997 B2
(45) Date of Patent: Oct. 9, 2007

(54) VOLTAGE CONTROLLED OSCILLATOR WITH A MULTIPLE GATE TRANSISTOR AND METHOD THEREFOR

(75) Inventors: Sriram S. Kalpat, Austin, TX (US); Leo Mathew, Austin, TX (US); Mohamed S. Moosa, Round Rock, TX (US); Michael A. Sadd, Austin, TX (US); Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 36 days.

(21) Appl. No.: 11/250,994

(22) Filed: Oct. 14, 2005

(65) Prior Publication Data

US 2007/0085153 A1   Apr. 19, 2007

(51) Int. Cl.
*H03L 7/099* (2006.01)

(52) U.S. Cl. .......................................... 331/57; 331/185
(58) Field of Classification Search .................. 331/57, 331/185, 186
See application file for complete search history.

(56) References Cited

U.S. PATENT DOCUMENTS

| | | | |
|---|---|---|---|
| 4,872,010 A | 10/1989 | Larson et al. | |
| 5,144,170 A | 9/1992 | Parker | |
| 5,463,353 A | 10/1995 | Countryman et al. | |
| 5,604,700 A | 2/1997 | Parris et al. | |
| 5,675,341 A | 10/1997 | Vallancourt et al. | |
| 5,912,591 A * | 6/1999 | Yamada | 331/57 |
| 5,936,433 A | 8/1999 | Holloway | |
| 6,222,395 B1 | 4/2001 | Bertin et al. | |
| 6,462,527 B1 | 10/2002 | Maneatis | |
| 6,677,569 B2 | 1/2004 | Beusch | |
| 6,720,812 B2 | 4/2004 | Tumer et al. | |
| 6,756,826 B1 | 6/2004 | Klein et al. | |
| 6,759,875 B2 * | 7/2004 | Mano et al. | 326/95 |
| 6,774,733 B2 * | 8/2004 | Arima | 331/57 |
| 6,842,136 B1 | 1/2005 | Agarwal et al. | |
| 6,872,702 B1 | 3/2005 | Kessler et al. | |
| 6,969,656 B2 | 11/2005 | Du et al. | |
| 6,972,702 B1 | 12/2005 | Moon | |

* cited by examiner

*Primary Examiner*—Robert Pascal
*Assistant Examiner*—James Goodley
(74) *Attorney, Agent, or Firm*—Robert L. King

(57) ABSTRACT

A voltage controlled oscillator (VCO) has a plurality of series-connected inverters. Within each inverter a first transistor has a first current electrode coupled to a first power supply voltage terminal, a second current electrode, a first control electrode coupled to an output terminal of another inverter of the plurality of series-connected inverters, and a second control electrode for receiving a first bias signal. A second transistor has a first current electrode coupled to the second current electrode of the first transistor, a second current electrode coupled to a second power supply voltage terminal, and a first control electrode coupled to the first control electrode of the first transistor. The second control electrode of the first transistor of each inverter receives a same or separate analog control signal to adjust the threshold voltage of the first transistors thereof to affect frequency and phase of the VCO's signal.

14 Claims, 4 Drawing Sheets

VOLTAGE CONTROLLED OSCILLATOR WITH A MULTIPLE GATE TRANSISTOR AND METHOD THEREFOR

RELATED APPLICATIONS

A related, copending application is entitled "Method and Circuit for Multiplying Signals With a Transistor Having More Then One independent Gate Structure", by Yang Du et al., U.S. application Ser. No. 10/728,621, assigned to Freescale Semiconductor, and was filed on Dec. 5, 2003, now U.S. Pat. 6,969,656.

A related, copending application is entitled "Fully Programmable Phase Locked Loop", by Hector Sanchez et al., U.S. application Ser. No. 11/069,664, assigned to Freescale Semiconductor, Inc., and was filed on Mar. 1, 2005, now U.S. Pat. 7,135,934.

A related application is entitled "Signal Converters With Multiple Gate Devices" by Mohamed Moosa et al., U.S. application Ser. No. 11/250,993, assigned to Freescale Semiconductor, Inc. and filed simultaneously herewith, now U.S. Pat. 7,215,268.

A related application is entitled "Voltage Controlled Oscillator Having Digitally Controlled Phase Adjustment And Method Therefor" by Hector Sanchez et al., U.S. application Ser. No. 11/251,467, assigned to Freescale Semiconductor, Inc. and filed simultaneously herewith, now U.S. Pat. 7,256,657.

FIELD OF THE INVENTION

The present invention relates generally to electronic circuits, and more particularly, to voltage controlled oscillators (VCOs).

BACKGROUND OF THE INVENTION

Voltage controlled oscillators (VCOs) generate a periodic clock signal in response to an input voltage. There are numerous applications for VCOs such as in tunable frequency generators. Additionally, VCOs are often used in phase locked loop (PLL) circuits to generate an output signal that is dynamically phase and frequency compared to an input reference signal. To keep the generated output signal aligned with the input reference signal, the phase difference is monitored and a correction circuit is used to change either the phase or the frequency (or both) of the generated clock signal to match the phase and frequency of the reference clock. Designers of VCOs have been faced with the problem of providing a relatively small and easy-to-implement phase correction circuit that will operate at low power supply voltages (e.g. 1.0-1.5 volts) while having a wide range of frequency operation and a wide range of phase correction.

Therefore, it is desirable to provide an integrated circuit VCO having a phase correction circuit that is small and easy to implement.

DETAILED DESCRIPTION

Generally, the present invention provides, in one form, a VCO having one or more inverters. The inverters are formed using a MIGFET (multiple independent gate field effect transistor) that has two independent gates or control electrodes: The VCO includes a ring oscillator implemented as a plurality of serially coupled inverters. Each inverter has a first transistor connected to a second transistor, wherein the first transistor has a first gate connected to an output of a preceding inverter and a second gate for receiving a bias signal. In the illustrated embodiments, the MIGFETs are biased by an analog voltage to provide a predetermined amount of drive current to adjust either phase or frequency of the VCO.

The disclosed VCO requires relatively less surface area, is simple, and is easy to implement. Also, as compared to prior art phase correction circuits, the disclosed VCO requires fewer conductors and fewer contacts, thus reducing resistance and parasitic capacitances, simplifying the circuit, and improving operating frequency range.

Figure 1:
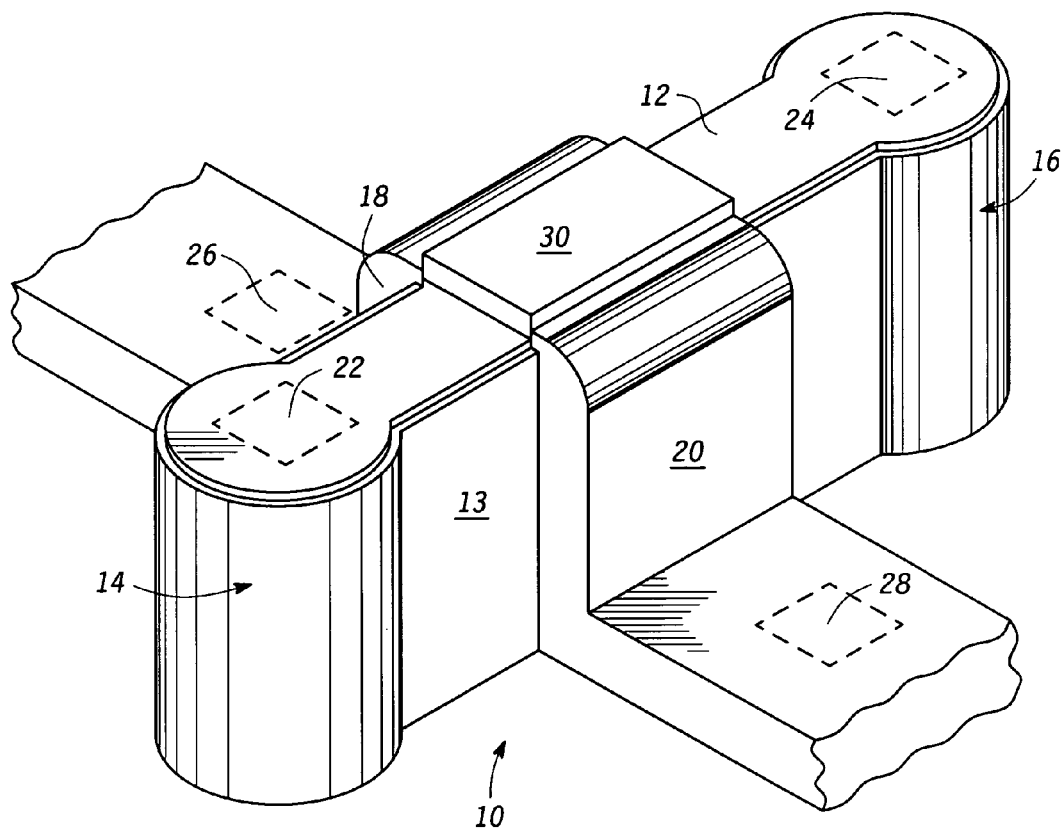
FIG. 1 illustrates in partial isometric form one embodiment of a multiple independent gate field-effect transistor (MIGFET).

FIG. 1 is a partial isometric view of one embodiment of a multiple independent gate field-effect transistor (MIGFET) 10 that can be used with the VCO 40 illustrated in FIG. 2 and described below. The MIGFET 10 includes a fin structure 12 formed over a substrate, for example a bulk substrate or silicon-on-insulator (SOI). The fin structure has first and second sidewalls. The fin structure 12 is formed from a semiconductor material. A dielectric layer 13 is formed over the surface of the substrate and the fin structure and a layer of gate material is formed over the dielectric layer 13 as illustrated in FIG. 1 to form gate electrodes on opposite sides of the fin structure 12. Specifically, the gate material is formed over the substrate, the first sidewall of the fin to form a first gate 18, and the second sidewall of the fin to form a second gate 20. The first and second gates 18 and 20 have a predetermined height on the sidewalls of the fin structure 12, and are electrically isolated from each other. In one embodiment, the gate material may be deposited over the top of the fin structure, and then selectively removed to provide isolation between the first and second gates 18 and 20. Fin structure 12 includes current terminal regions 14 and 16 located in each end of fin structure 12. In one embodiment where the resultant transistor structure is a field effect transistor (FET), current terminal regions 14 and 16 serve as the source and drain regions, respectively. Contacts 22, 24, 26, and 28 provide for electrical connection to the MIGFET 10. The contacts connect to metal layers implemented above the gate and the source/drain terminals (not shown). Note that in the illustrated embodiment, one contact is shown for each gate structure and source/drain connections; however, there may be any number of contacts as long as an acceptable electrical connection can be made. A nitride layer 30 is formed over a top surface of the fin structure 12. In other embodiments, nitride layer 30 may be made of other materials (e.g. other dielectrics).

During the operation of MIGFET 10, when a voltage is applied to one of the gates 18 and 20, a channel region is formed underneath the gate in the fin structure 12 providing a current path between the source and drain current terminal regions 14 and 16, respectively. Note that the channel regions may be undoped, doped to be N-type semiconductor, P-type semiconductor, or a combination of N-type and P-type semiconductor.

The illustrated embodiment discloses a transistor structure having two independent gates. In other embodiments, a transistor structure may have more than two gate structures. For example, the MIGFET 10 may have an additional gate on top of the fin structure 12 in place of the nitride layer 30. Also, in other embodiments, a plurality of transistors like MIGFET 10 may be connected together in parallel if additional drive strength is required.

Figure 2:
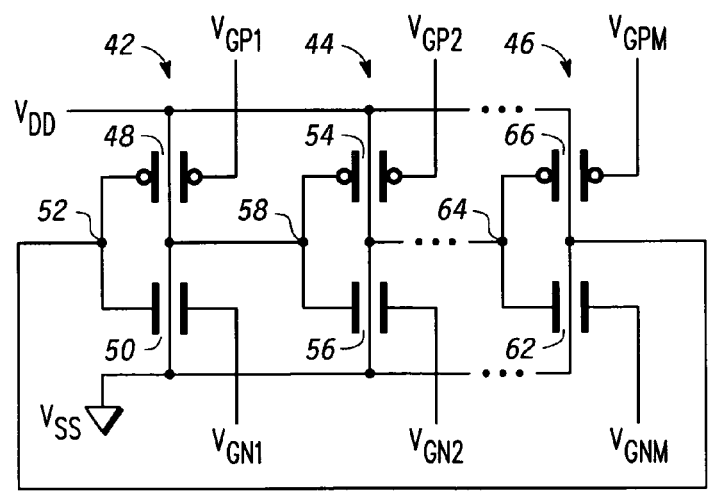
FIG. 2 illustrates in schematic diagram form a VCO in accordance with one form of the present invention.

FIG. 2 illustrates, in schematic diagram form, a VCO 40 in accordance with one form of the present invention. VCO 40 includes inverters 42, 44, and 46. Inverter 42 is formed by a P-channel MIGFET 48 and an N-channel MIGFET 50. Inverter 44 is formed by a P-channel MIGFET 54 and an N-channel MIGFET 56. Inverter 46 is formed by a P-channel MIGFET 66 and an N-channel MIGFET 62. The P-channel MIGFET 48 has a source connected to a supply voltage $V_{DD}$ and a drain connected to a drain of the N-channel MIGFET 50. A first control electrode or gate of MIGFET 48 is connected to a node 52 and to a first gate of MIGFET 50. A second gate of MIGFET 48 is connected to a first bias voltage labeled $V_{GP1}$. A second gate of MIGFET 50 is connected to a bias voltage labeled $V_{GN1}$. A source of MIGFET 50 is connected to a supply voltage terminal labeled $V_{SS}$. Similarly, the P-channel MIGFET 54 has a source connected to the supply voltage VDD and has a drain connected to a drain of N-channel MIGFET 56. A first gate of MIGFET 54 is connected to the gate of MIGFET 56 at a node 58. A second gate of MIGFET 54 is connected to a bias voltage labeled $V_{GP2}$. A second gate of MIGFET 56 is connected to a bias voltage labeled $V_{GN2}$. A source of P-channel MIGFET 66 is connected to the supply voltage $V_{DD}$. A drain of MIGFET 66 is connected to a drain of N-channel transistor 62 at node 52. Therefore, the output of inverter 46 is connected to an input of inverter 42. A first gate of MIGFET 66 is connected to a first gate of MIGFET 62. A second gate of MIGFET 66 is connected to a bias voltage $V_{GPM}$, where M is an integer. It should be understood that any number of additional inverters may be coupled in series between inverter 44 and inverter 46 such that the total number of inverter states is odd. In one form, such additional inverters would have the same configuration as the illustrated inverters of FIG. 2. It should also be appreciated that as few as one series-connected inverter may be implemented to form a VCO circuit. A second gate of MIGFET 62 is connected to a bias signal $V_{GNM}$. It should be noted that an output of VCO 40 may be taken at any of nodes 52, 58 or 64 as each inverter has a preceding inverter coupled to an input thereof as a result of the feedback connection from inverter 46 to inverter 42 via node 52.

In operation, VCO 40 functions to provide an oscillating signal. Each inverter of inverters 42, 44 and 46 function to change the logic state of the signal and thus creates an unstable or oscillating signal. For example, at node 52 a logic high signal is converted to a logic low signal at node 58. Similarly, the logic low signal at node 58 is converted back to a logic high signal at node 64, assuming that there are no intervening inverter stages between inverter 44 and inverter 46. The bias signal $V_{GP1}$ which is applied to the second gate of MIGFET 48 changes the conductivity of the MIGFET 48. In one form the conductivity is changed by changing the transistor's threshold voltage with respect to the first gate of MIGFET 48. By modifying the threshold voltage of a MIGFET, the speed at which the transistor switches is modified. As the switching speed of a transistor is varied, the frequency of operation of a circuit using the transistor varies. For a P-channel MIGFET like MIGFET 48, as the voltage that is applied to the second gate is lowered, the MIGFET will switch when higher voltage is applied to the first gate. The switching speed of the MIGFET 48 is therefore increased because the transistor switches at a sooner point as the bias voltage applied to the first gate transitions from a logic high to a logic low. The reverse is true for the N-channel MIGFETs such as MIGFET 50. As the voltage that is applied to the second gate of MIGFET 50 is increased, the MIGFET will switch when a lower voltage is applied to the first gate, and therefore the MIGFET 50 will have a higher conductivity for a given bias applied to the first gate. The switching speed of the MIGFET 50 is therefore increased because the transistor switches at a sooner point as the bias voltage applied to the first gate transitions from a logic low to a logic high. Therefore, the switch point for each of inverters 42, 44 and 46 may be individually modified with a separate second gate bias voltage. The modification of the switching speeds of the inverters functions to modify the phase relationships between the oscillating signals present at nodes 52, 58 and 64 and to change the frequency of operation of the VCO 40.

Figure 3:
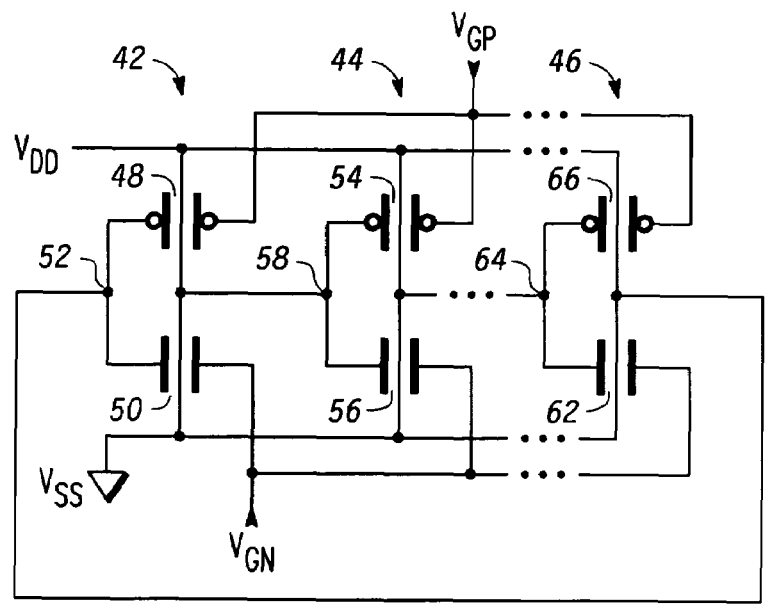
FIG. 3 illustrates in schematic diagram form a VCO in accordance with another form of the present invention.

Illustrated in FIG. 3 is a VCO 40' which is an alternate form of VCO 40 of FIG. 2. For convenience of comparison and discussion, common circuit elements between the two figures are given the same element reference numbers. As illustrated, the second gate of each of MIGFETs 48, 54 and 60 are connected together and to a single bias voltage $V_{GP}$. Similarly, the second gate of each of MIGFETs 50, 56 and 62 are connected together and to a single bias voltage $V_{GN}$.

In operation, a single bias voltage is connected to the second gate of all of the P-channel MIGFETs and a separate single bias voltage is connected to the second gate of all of the N-channel MIGFETs. In the illustrated form the VCO 40' is a simplified form of VCO 40 since there are only two control or bias signals that modify the frequency of the circuit. It should be noted that while VCO 40' has simplified control, there are fewer frequency change settings. However, because the bias signals Vgp and Vgn are analog control signals that can have numerous values, the amount of frequency adjustment possible in VCO 40' is quite flexible.

Figure 4:
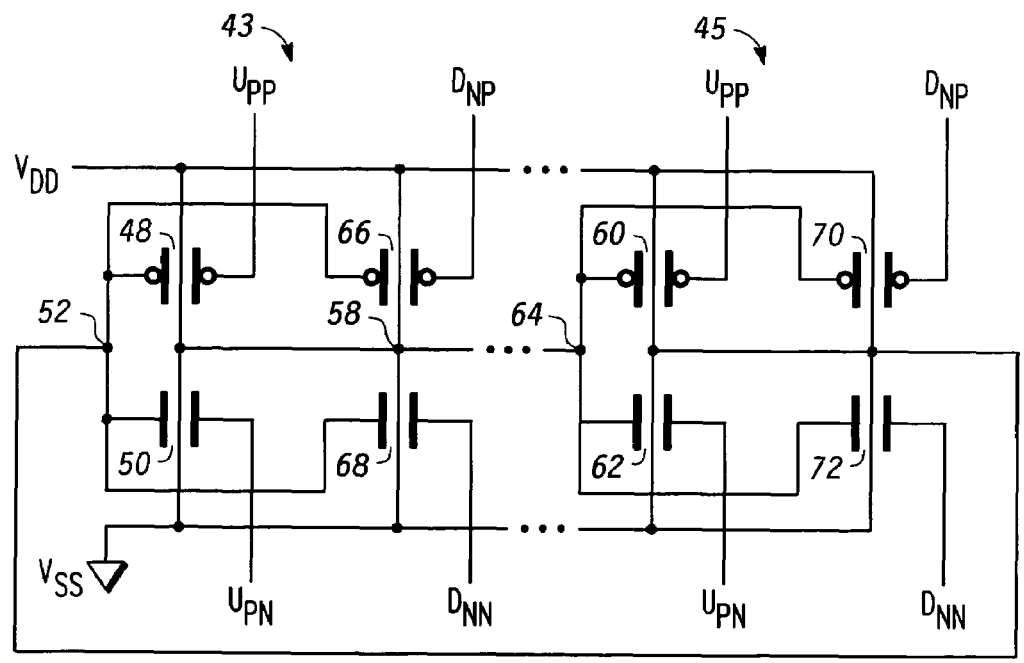
FIG. 4 illustrates in schematic diagram form a VCO in accordance with yet another form of the present invention.

Illustrated in FIG. 4 is yet another form of a VCO. The VCO of FIG. 4 has transistors which permit the control of instantaneous phase of the signal. In one form the VCO may be used to change the instantaneous phase in response to a sensed or measured phase difference between a reference signal and a feedback signal of a phase locked loop (not shown). A first oscillator stage 43 has a first inverter formed by a P-channel MIGFET 48 and an N-channel MIGFET 50 and a second inverter formed by a P-channel MIGFET 66 and an N-channel MIGFET 68. MIGFET 48 has a source connected to a terminal for receiving a supply voltage labeled $V_{DD}$, a first gate connected to a node 52 and to a first gate of MIGFET 50, a drain connected to a drain of MIGFET 50 at a node 58 and a second gate. The second gate of MIGFET 48 is connected to an analog control bias signal labeled $U_{PP}$. A second gate of MIGFET 50 is connected to an analog control bias signal labeled $U_{PN}$, and a source of MIGFET 50 is connected to a terminal for receiving a ground reference voltage labeled $V_{SS}$. The first oscillator stage 43 also has a second inverter formed by a P-channel MIGFET 66 and an N-channel MIGFET 68. MIGFET 66 has a source connected to the terminal for receiving $V_{DD}$, a first gate connected to the first gate of MIGFET 48 at node 52, a second gate connected to an analog control bias signal labeled $D_{NP}$ and a drain connected to a node 58. The drain of MIGFET 66 is connected to a drain of MIGFET 68. A first gate of MIGFET 68 is connected to the first gate of MIGFET 50 at node 52, and a second gate of MIGFET 68 is connected to a control bias signal labeled $D_{NN}$. A source of MIGFET 68 is connected to the terminal for receiving $V_{SS}$. The first oscillator stage 43 therefore has two parallel-connected inverters formed of series-connected MIGFET transistors that have separately controlled second gates.

A second stage 45 has a first inverter formed of a P-channel MIGFET 60 and an N-channel MIGFET 62. MIGFET 60 has a source connected to the voltage terminal for receiving $V_{DD}$, a first gate connected to a node 64, a second gate connected to a control bias signal labeled $U_{PP}$, and a drain. MIGFET 62 has a drain connected to the drain of MIGFET 60, a first gate connected to the first gate of MIGFET 60 at a node 64, a second gate connected to a control bias signal labeled $U_{PN}$, and a source connected to the terminal for receiving the voltage $V_{SS}$. A second inverter formed of a P-channel MIGFET 70 and an N-channel MIGFET 72 is connected in parallel with the first inverter of second stage 45. A source of MIGFET 70 is connected to the voltage terminal for receiving $V_{DD}$. MIGFET 70 has a first gate connected to the node 64, a second gate connected to a control bias signal labeled $D_{NP}$, and a drain. A drain of MIGFET 70 is connected to a drain of MIGFET 72. A first gate of MIGFET 72 is connected to the first gate of MIGFETs 60, 62 and 70 at node 64. A second gate of MIGFET 72 is connected to a bias control voltage labeled $D_{NN}$. A source of MIGFET 72 is connected to the terminal for receiving the voltage $V_{SS}$. In the illustrated form, any additional number from one onward of stages may be provided as indicated by the dots between the first stage and the second stage, as long as the total number of stages is odd. The number of stages is dependent, in part, on the frequency range of operation that is desired. The fewer the number of stages results in a higher frequency of operation.

In operation, a signal that is processed by the inverters of the VCO of FIG. 4 changes logic state between an input and an output of each inverter. Because node 52 connects the output of the inverter formed of MIGFETs 70 and 72 to the input of the inverter formed of MIGFETs 48 and 50, a continuous path is provided for a signal to continually change states. An output of the VCO may be taken at either node 52 or node 64. This output may be connected to other circuitry (not shown) such as a delay locked loop (DLL) or a phase locked loop (PLL). The phase of the signal may be compared with the phase of a reference signal. If the phase of the signal from the VCO of FIG. 4 is desired to be modified, the phase may be changed through the use of the up and down bias signals $U_p$ and $D_N$. Depending upon whether the bias signals are applied to a P-channel transistor or an N-channel transistor determines whether the $U_{PP}$ or the $U_{PN}$ signal is used for an up signal. Initially assume that the bias voltages $U_{PP}$ and $U_{PN}$ are set so that MIGFETs 48 and 50 are not conductive and that the bias voltages $D_{NP}$ and $D_{NN}$ are set so that MIGFETs 66 and 68 are conductive. If there is a phase difference between the signal and a reference signal, the analog bias signals can be modified to make MIGFETs 48 and 50 become slightly conductive and add drive strength to the collective inverter function of the first stage. As a result of the additional current that is sourced or sunk by the inverter formed of MIGFETs 48 and 50, the phase of the signal conducted by the first oscillator stage 43 is adjusted as needed. The $U_{PP}$ and $U_{PN}$ signals are used to increase the frequency of the signal. The increase in frequency shifts the phase of the signal in a positive direction. Conversely, the $D_{NP}$ and $D_{NN}$ signals are used to decrease the frequency of the signal. The decrease in frequency shifts the phase of the signal in a negative direction. It should be appreciated that with the use of the $U_{PP}$, $U_{PN}$, $D_{NP}$ and $D_{NN}$ signals of the VCO of FIG. 4 both phase and frequency shifting of the signal may be implemented. For example, the signals $U_{PP}$ and $D_{NP}$ may be kept constant and signals $U_{PN}$ and $D_{NN}$ may be varied to primarily modify the frequency of the signal. Additionally, variation of all four or combinations of all four of these signals may be made to change both the frequency and the phase of the VCO's signal.

Figure 5:
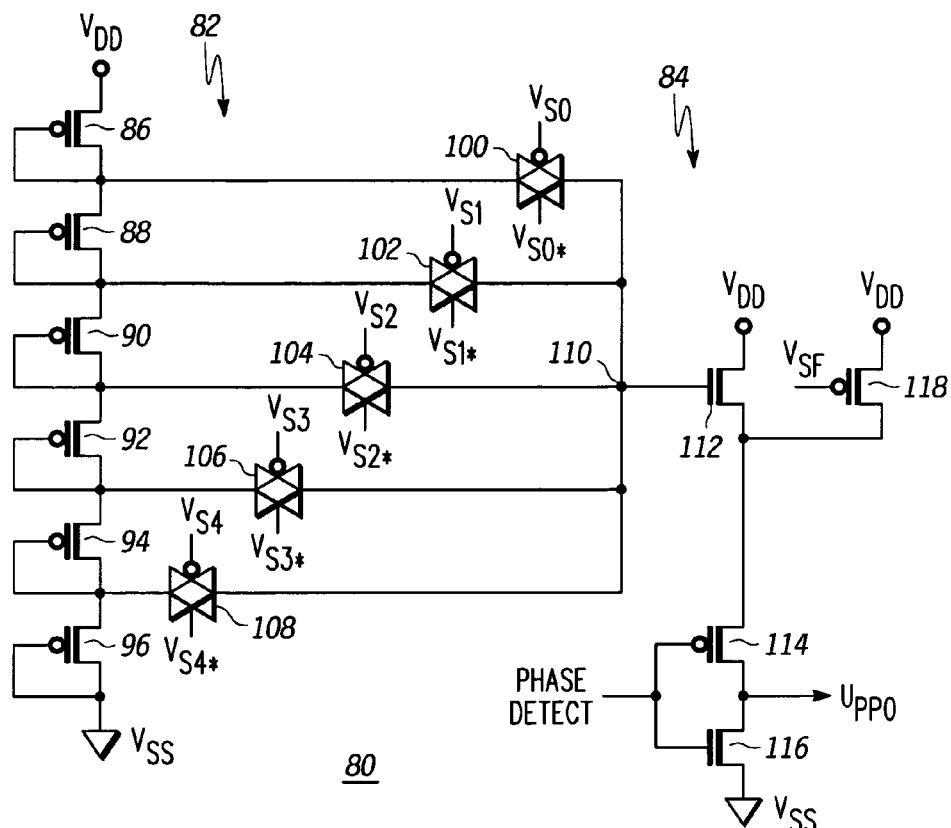
FIG. 5 illustrates in schematic diagram form a control signal generation circuit for use with the VCO of claim 4.

Illustrated in FIG. 5 is an exemplary implementation of a control signal circuit 80 to provide the control signal $U_{PNO}$ which is the $U_{PN}$ signal of a first stage in a VCO. The control signal circuit 80 has a voltage divider portion 82 and a drive output portion 84. A voltage divider is formed by a plurality of diode-connected P-channel transistors 86, 88, 90, 92, 94 and 96 that are connected between a supply voltage $V_{DD}$ and a reference voltage terminal $V_{SS}$. At the drain of each of the transistors 86, 88, 90, 92, 94 and 96 is a tap in which a switch is connected. For example, a switch 100 is connected to the drain of transistor 86. A switch 102 is connected to the drain of transistor 88. A switch 104 is connected to the drain of transistor 90. A switch 106 is connected to the drain of transistor 92. A switch 108 is connected to the drain of transistor 94. In the illustrated form the switches 100, 102, 104, 106 and 108 are implemented as CMOS transmission gates having a true and complementary control signal which is designated in FIG. 5 by an asterisk. Select voltages $V_{S0}$, $V_{S1}$, $V_{S2}$, $V_{S3}$ and $V_{S4}$ are respectively used to make the switches 100, 102, 104, 106 and 108 conductive. Each of switches 100, 102, 104, 106 and 108 has a terminal connected together to a node 110 and to a gate of an N-channel transistor 112. Transistor 112 has drain connected to the supply voltage terminal for receiving $V_{DD}$. A source of transistor 112 is connected to a source of a P-channel transistor 114. A drain of transistor 114 is connected to a drain of an N-channel transistor 116 and provides the control signal $U_{PP0}$ for the first stage. A source of transistor 116 is connected to the $V_{SS}$ reference voltage terminal. Transistors 114 and 116 each has a gate connected together for receiving an enable signal labeled "Phase Detect" from a phase detector of a phase locked loop (not shown). Additionally, a P-channel transistor 118 has a source connected to the $V_{DD}$ supply voltage terminal, a gate for receiving a full supply voltage control signal $V_{SF}$ and a drain connected to the source of transistor 114.

In operation, a phase detector provides a logic low enable signal to the gates of transistors 114 and 116 when a phase error is detected in the signal of the VCO. The phase detector also functions to determine what analog voltage value the signal $U_{PP0}$ should assume. Should a full supply voltage $V_{DD}$ value be needed, the signal $V_{SF}$ is asserted as a logic low. Should a lower value of voltage be needed to correct the detected phase error, one of the signals from $V_{S0}$ to $V_{S4}$ is asserted and a predetermined fraction of $V_{DD}$ is used to drive transistor 112. The drive strength of the bias voltage for transistor 112 determines the value of voltage of the control signal $U_{PP0}$. The signal value of $U_{PP0}$ may be changed readily by the phase detector by changing the control signals $V_{S0}$ to $V_{S4}$ and $V_{SF}$. Similar circuits (not shown) may be used to generate the control signals $U_{PN0}$, $D_{NP0}$, $D_{NN0}$, etc. of the VCO of FIG. 4.

Figure 6:
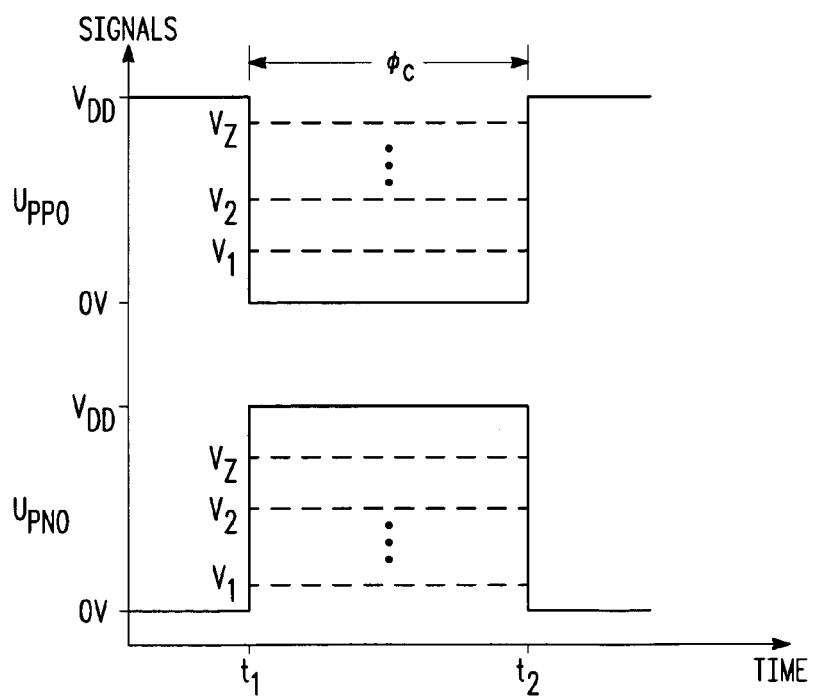
FIG. 6 illustrates in graphical form an exemplary control signal supplied by the control signal generation circuit of FIG. 5.

Illustrated in FIG. 6 is a graph illustrating an embodiment of the signals $U_{PP0}$ and $U_{PN0}$. Between a time labeled t1 and a time labeled t2 a phase correction operation is implemented. Depending upon the values of the control signals $V_{S0}$ through $V_{S4}$ (and complements) and $V_{SF}$ provided by a phase detector, an analog voltage control signal $U_{PP0}$ may assume any value between 0 volt to supply voltage $V_{DD}$. For example, a voltage of $V_1$, $V_2$ or $V_Z$ which are less than $V_{DD}$ may be connected to the second gate of MIGFET 48 of FIG. 4. Similarly, during the phase correction operation an analog voltage control signal $U_{PN0}$ is selected having a value between 0 volt and $V_{DD}$. A voltage of $V_1$, $V_2$ or $V_Z$ may be provided by control signal circuit 80 for biasing the second gate of MIGFET 50. Because an analog voltage is used fine tuning of phase and frequency errors may be accomplished.

Figure 7:
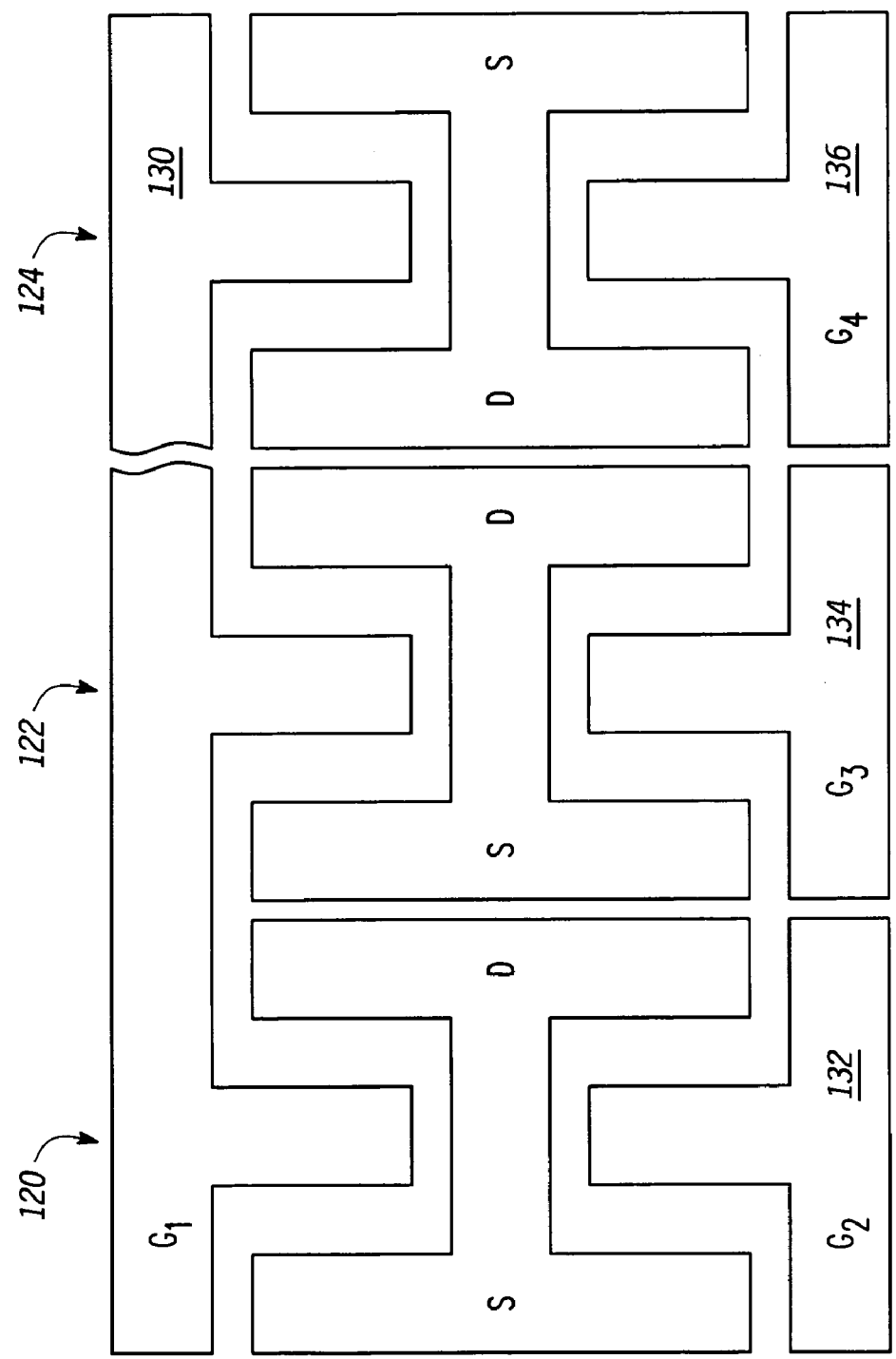
FIG. 7 illustrates in perspective form a layout of multiple transistors having independent gates that may be used to implement any of the VCOs of FIGS. 2-4.

Illustrated in FIG. 7 is a layout of an integrated circuit having three MIGFET transistors that may be used to implement a variety of circuits such as the VCO 40' of FIG. 3. In the example a MIGFET 120 is placed adjacent to a MIGFET 122. A MIGFET 124 is placed adjacent the MIGFET 122 but any number of intervening MIGFET devices may be inserted as indicated by a broken line in FIG. 7. The MIGFET 120 has a first gate G1 which is gate 130. Gate 130 is common with MIGFET 122 and MIGFET 124 and is a continuous piece of conductive material. MIGFET 120 also has a second gate G2 which is gate 132. Between the gate 132 and gate 130 within MIGFET 120 is a source (S) and a drain (D) separated by a channel. Similarly, MIGFET 122 has a second gate G3 which is gate 134. Between the gate 134 and gate 130 is a source (S) and a drain (D) separated by a channel. MIGFET 124 has a second gate G4 which is gate 136. Between the gate 136 and gate 130 is a drain (D) and a source (S) separated by a channel. It should be noted that the drains of MIGFETs 122 and 124 are positioned adjacent each other whereas the adjacent MIGFETs 120 and 122 have a drain positioned adjacent a source. The source, drain and channel of each of the MIGFETs 120, 122 and 124 form an elevated fin structure having a height extending above a plane in which the gates 130, 132, 134 and 136 lie. In the illustrated layout, a single continuous gate material is used at the level in which the gate is formed rather than making a connection to the second gate of each MIGFET at a different level of the integrated circuit or laterally extended from the portion of the layout that is illustrated in FIG. 7. The layout is therefore compact and yet permits the first gate of each MIGFET to be physically separate and distinct. The illustrated source (S) and drain (D) electrodes of FIG. 7 are analogous to regions 14 and 16 of FIG. 1 which are formed on a surface of an integrated circuit and have a height above the surface. A fin structure is formed from a plurality of current electrodes (i.e. sources and drains) that, in one form, are arranged in a line. For example, the line in FIG. 7 is a line (not expressly shown) that intersects each of the illustrated sources (S) and drains (D). However, it should be understood that in other forms the placement of the sources and drains of the multiple transistors may be in an "L" shape, a curved shape or an offset pattern. A channel region is formed in the connecting material between each source and drain and adjacent each illustrated gate. Thus a plurality of channel regions is formed between the sources and drains with one channel region between each source and drain. In one form the plurality of channel regions is formed parallel to the surface of the integrated circuit. In other forms the channel regions may be in different planes.

By now it should be appreciated that there has been provided an improved voltage controlled oscillator using MIGFET devices that have multiple independent gates. Lower supply voltages may be used in connection with the VCOs described herein because there is accurate ability to modify the threshold voltage of transistors and thus accurately control the impedance between the conducting electrodes of the transistors. While the invention has been described in the context of a preferred embodiment, it will be apparent to those skilled in the art that the present invention may be modified in numerous ways and may assume many embodiments other than that specifically set out and described above. For example, the conductivity types of the transistors may be reversed. Accordingly, it is intended by the appended claims to cover all modifications of the invention which fall within the true scope of the invention. Various changes and modifications to the embodiments herein chosen for purposes of illustration will readily occur to those skilled in the art. For example, although a specific transistor structure in FIG. 1 is discussed as an example of a transistor having multiple independent gates, it should be readily understood that other types of transistor structures having two or more independent gates may be used herein. Although specific exemplary circuits have been shown, numerous VCO circuit implementations may be used to embody the functions discussed herein. To the extent that such modifications and variations do not depart from the spirit of the invention, they are intended to be included within the scope thereof which is assessed only by a fair interpretation of the following claims.

In one form there is herein provided a voltage controlled oscillator having a plurality of series-connected inverters. Each inverter of the plurality of series-connected inverters has a first transistor and a second transistor. The first transistor has a first current electrode coupled to a first power supply voltage terminal, a second current electrode, a first control electrode coupled to an output terminal of a preceding inverter of the plurality of series-connected inverters, and a second control electrode for receiving a first bias signal. The second transistor has a first current electrode coupled to the second current electrode of the first transistor, a second current electrode coupled to a second power supply voltage terminal, and a first control electrode coupled to the first control electrode of the first transistor. In one form the first bias signal is for adjusting a threshold voltage, the threshold voltage being a voltage required to form a channel in the first transistor in response to an input signal at the first control gate of the first transistor. In another form the second control electrode of each of the first transistors is coupled together to receive the first bias signal. In yet another form the second control electrode of each of the first transistors receives a different bias signal. In one form the first bias signal is variable within a predetermined voltage range to adjust an oscillation frequency of the voltage controlled oscillator. In another form the first bias signal is variable to change a conductivity of the first transistor. In another form the second transistor is a second control electrode for receiving a second bias signal. In another form the voltage controlled oscillator further has a third transistor, the third transistor having a first current electrode coupled to the first power supply voltage terminal, a second current electrode coupled to the second current electrode of the first transistor, a first control electrode coupled to the first control electrode of the first transistor, and a second control electrode for receiving a second bias signal, wherein the second bias signal is provided separately from the first bias signal. In yet another form the second bias signal is variable within a predetermined voltage range for adjusting a phase of an output signal of the voltage controlled oscillator.

There is also provided a method for controlling a voltage controlled oscillator. A plurality of inverters is coupled together in series, each of the plurality of inverters having a first transistor and a second transistor coupled together in series between a first power supply terminal and a second power supply terminal, the first transistor and the second transistor both having a first control electrode coupled to an output terminal of another one of the plurality of inverters, and the first transistor having a second control electrode for receiving a first bias signal. A voltage of the first bias signal is varied to adjust an oscillation frequency of the voltage controlled oscillator. In one form a different bias signal is provided to the second control electrode of each first transistor of the plurality of inverters. In yet another form a second control electrode is provided for the second transistor of each of the plurality of inverters, the second control electrode receiving a second bias signal. In one form there is provided a third transistor, the third transistor having a first current electrode coupled to the first power supply terminal, a second current electrode coupled to the second current electrode of the first transistor, a first control electrode coupled to the first control electrode of the first transistor, and a second control electrode for receiving a second bias signal, wherein the second bias signal is provided separately from the first bias signal. In one form the second bias signal is variable within a predetermined voltage range for adjusting a phase of an output signal of the voltage controlled oscillator. In another form a fourth transistor is provided, the fourth transistor having a first current electrode coupled to the second current electrode of the first transistor, a first control electrode coupled to the first control electrode of the second transistor, and a second control electrode for receiving a third bias signal, wherein the third bias signal is provided separately from the first bias signal. In yet another form the third bias signal is variable within a predetermined voltage range for adjusting a phase of an output signal of the voltage controlled oscillator.

In another form there is provided an integrated circuit having a fin structure formed on a surface of the integrated circuit and having a height above the surface. The fin structure has a plurality of current electrodes and a plurality of channel regions wherein a single channel region is between any two of predetermined ones of the plurality of current electrodes. A first control electrode structure is formed adjacent to a first side of the fin structure and has a first strip of continuous conductive material that controls the plurality of channel regions. A second control electrode structure is formed adjacent to a second side of the fin structure opposite the first side of the fin structure. The second control electrode structure has multiple strips of the conductive material that are physically separate. Each of the multiple strips of the conductive material controls a separate, single one of the plurality of channel regions. In one form the plurality of current electrodes has a plurality of sources and a plurality of drains, and the fin structure has a first drain positioned adjacent a physically unconnected first source and has a second drain positioned adjacent a physically unconnected third drain. In another form the fin structure and the first and second control electrode structures form a plurality of multiple-gate transistors. In yet another form each of the multiple strips of the conductive material of the second control electrode structure is configured to receive a distinct separate voltage signal.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A voltage controlled oscillator comprising:
   a plurality of series-connected inverters, each inverter of the plurality of series-connected inverters comprising:
   a first transistor having a fin structure comprising a first current electrode coupled to a first power supply voltage terminal, a second current electrode, a first control electrode adjacent a first sidewall of the fin structure and coupled to an output terminal of another inverter of the plurality of series-connected inverters, and a second control electrode adjacent a second sidewall of the fin structure for receiving a first bias signal; and
   a second transistor having a first current electrode coupled to the second current electrode of the first transistor, a second current electrode coupled to a second power supply voltage terminal, and a first control electrode coupled to the first control electrode of the first transistor.

2. The voltage controlled oscillator of claim 1, wherein the first bias signal is for adjusting a threshold voltage, the threshold voltage being a voltage required to form a channel in the first transistor in response to an input signal at the first control electrode of the first transistor.

3. The voltage controlled oscillator of claim 1, wherein the second control electrode of each first transistor is coupled together to receive the first bias signal.

4. The voltage controlled oscillator of claim 1, wherein the second control electrode of each first transistor receives a different bias signal.

5. The voltage controlled oscillator of claim 1, wherein the first bias signal is variable within a predetermined voltage range to adjust an oscillation frequency of the voltage controlled oscillator.

6. The voltage controlled oscillator of claim 1, wherein the first bias signal is variable to change a conductivity of the first transistor.

7. The voltage controlled oscillator of claim 1, wherein the second transistor further comprises a second control electrode for receiving a second bias signal.

8. The voltage controlled oscillator of claim 1 further comprising a third transistor, the third transistor having a first current electrode coupled to the first power supply voltage terminal, a second current electrode coupled to the second current electrode of the first transistor, a first control electrode coupled to the first control electrode of the first transistor, and a second control electrode for receiving a second bias signal, wherein the second bias signal is provided separately from the first bias signal.

9. The voltage controlled oscillator of claim 8, wherein the second bias signal is variable within a predetermined voltage range for adjusting a phase of an output signal of the voltage controlled oscillator.

10. A voltage controlled oscillator comprising:
   a plurality of series-connected inverters, each inverter of the plurality of series-connected inverters comprising:
      a P-channel multiple independent gate transistor having a fin structure comprising a first current electrode coupled to a first power supply voltage terminal and a second current electrode, a first control electrode adjacent to and separated from the fin structure by a first dielectric layer, the first control electrode overlying a substrate and coupled to an output terminal of another inverter of the plurality of series-connected inverters, and a second control electrode adjacent to and separated from the fin structure by the first dielectric layer, the second control electrode overlying the substrate for receiving a predetermined one of a plurality of analog control signals to adjust a threshold voltage of the P-channel multiple independent gate transistor to affect frequency and phase of the voltage controlled oscillator; and
      an N-channel multiple independent gate transistor connected in series with the P-channel multiple independent gate transistor and having a first current electrode coupled to the second current electrode of the P-channel multiple independent gate transistor, a second current electrode coupled to a second power supply voltage terminal, a first control electrode adjacent to and separated from the fin structure by a second dielectric layer, the first control electrode overlying the substrate and coupled to the first control electrode of the P-channel multiple independent gate transistor, and a second control electrode adjacent to and separated from the fin structure by the second dielectric layer, the second control electrode overlying the substrate and coupled to another predetermined one of the plurality of analog control signals.

11. The voltage controlled oscillator of claim 10 wherein the second control electrode of each P-channel multiple independent gate transistor receives a different one of the plurality of analog control signals.

12. The voltage controlled oscillator of claim 10 wherein the second control electrode of each P-channel multiple independent gate transistor receives a same one of the plurality of analog control signals.

13. A method of providing a voltage controlled oscillator comprising:
   providing a first inverter, the first inverter comprising:
      a first P-channel multiple independent gate transistor having a first fin structure comprising a first current electrode coupled to a first power supply voltage terminal and a second current electrode, a first control electrode formed adjacent a first sidewall of the first fin structure, and a second control electrode formed adjacent a second sidewall of the first fin structure for receiving a predetermined one of a first plurality of analog control signals to adjust transistor threshold voltage to affect frequency and phase of the voltage controlled oscillator; and
      a first N-channel multiple independent gate transistor connected in series with the P-channel multiple independent gate transistor and having a second fin structure comprising a first current electrode coupled to the second current electrode of the P-channel multiple independent gate transistor, a second current electrode coupled to a second power supply voltage terminal, a first control electrode formed adjacent a first sidewall of the second fin structure and coupled to the first control electrode of the first transistor, and a second control electrode formed adjacent a second sidewall of the second fin structure for receiving a predetermined one of a second plurality of analog control signals to adjust transistor threshold voltage to affect frequency and phase of the voltage controlled oscillator; and
   providing one or more additional inverters in series with the first inverter, the one or more additional inverters each comprising a P-channel multiple independent gate transistor in series with an N-channel multiple independent gate transistor.

14. The method of claim 13 further comprising:
   biasing the one or more additional inverters with control signals from the first plurality of analog control signals and the second plurality of analog control signals that differ from those used to bias the first inverter.

* * * * *